United States Patent [19]
Matsui

[11] Patent Number: 5,010,521
[45] Date of Patent: Apr. 23, 1991

[54] CMOS STATIC MEMORY

[75] Inventor: Masataka Matsui, Tokyo, Japan

[73] Assignee: Kabushiki Kaisha Toshiba, Kawasaki, Japan

[21] Appl. No.: 401,811

[22] Filed: Sep. 1, 1989

[30] Foreign Application Priority Data

Sep. 6, 1988 [JP] Japan ................. 63-223001

[51] Int. Cl.$^5$ ................. G11C 7/00
[52] U.S. Cl. ................. 365/189.01; 365/190; 365/154
[58] Field of Search ............ 365/154, 190, 189.11, 365/230.06, 189.01

[56] References Cited

U.S. PATENT DOCUMENTS 4,507,759  3/1985  Yasui et al. ................. 365/190

Primary Examiner—Joseph A. Popek
Attorney, Agent, or Firm—Finnegan, Henderson, Farabow, Garrett and Dunner

[57] ABSTRACT

A CMOS static memory includes a memory cell array having a plurality of memory cells two-dimensionally arranged in word and bit line directions, and peripheral circuits including n-type MOSFETs for performing a write/read operation for the memory cell. The memory cell includes a flip-flop circuit constituted by a pair of pull-down n-type MOSFETs and a pair of pull-up resistor elements, and a pair of transmission gate n-type MOSFETs. Each of a pair of pull-down n-type MOSFETs and the pair of transmission gate n-type MOSFETs have a gate oxide film having a thickness and gate length which are smaller than those of a gate oxide film of each n-type MOSFET in the peripheral circuits.

2 Claims, 4 Drawing Sheets

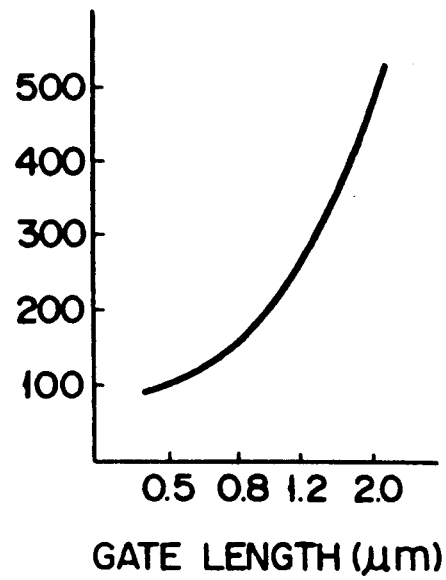
F I G. 3
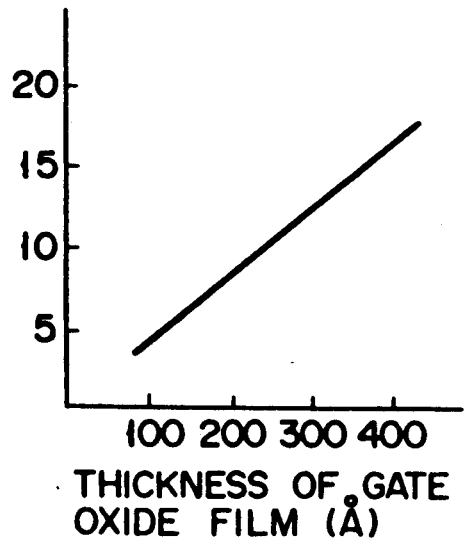
F I G. 4
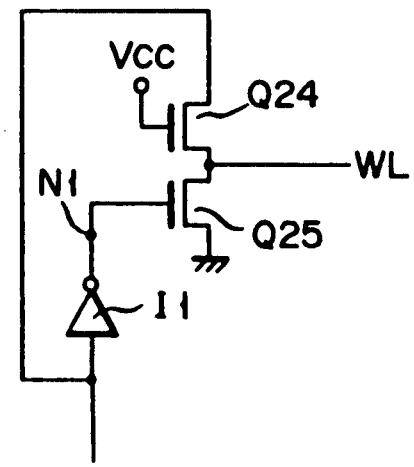
F I G. 8

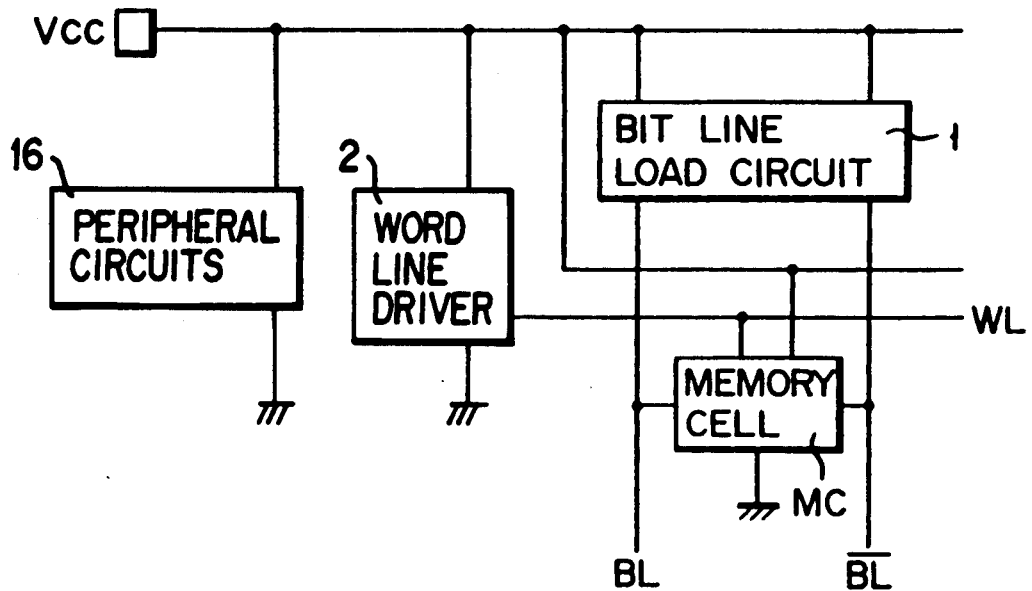
F I G. 6

5,010,521

CMOS STATIC MEMORY

BACKGROUND OF THE INVENTION

1. Field of the Invention

The present invention relates to a semiconductor memory device and, more particularly, to a complementary (CMOS) static memory using a MOS electric field transistor.

2. Description of the Related Art

An arrangement of a conventional CMOS static memory is shown in FIG. 1. More specifically, a memory cell MC includes a flip-flop circuit constituted by pull-up high resistors $R_1$ and $R_2$ connected to a power source $V_{CC}$ and pull-down n-type MOSFETs $Q_1$ and $Q_2$, and transmission gate transistors $Q_3$ and $Q_4$ selectively controlled by a word line WL. One end of each of the transistors $Q_3$ and $Q_4$ is connected to the corresponding one of a pair of bit lines BL and $\overline{BL}$, and the other end of each thereof is connected to the corresponding one of internal nodes a and b in the flip-flop circuit. The static memory includes a memory cell array constituted by two-dimensionally arranging a large number of memory cells MC in a word line WL direction and a bit line BL direction. Address input signals $A_0$ to $A_n$ are decoded by a decoder 11. When one word line WL and one pair of bit lines BL and $\overline{BL}$ are selected, data in a memory cell MC corresponding to a predetermined address is read or written. During a data read operation, complementary data of the bit lines BL and $\overline{BL}$ is differentially amplified by a sense amplifier 12, and the resultant data is output to data input/output signal pins I/O1 to I/OM by an output circuit 13, where M is the word length of the static memory. The memory cell MC serving as a static memory is controlled by a controller 14 for receiving a chip selection signal pin $\overline{CE}$, a read/write selection signal pin $\overline{WE}$, an output selection signal pin $\overline{OE}$, and an address transition detection signal $\phi_{AT}$ generated by the decoder 11.

A control operation of peripheral circuits of the memory cell MC will be described below. A bit line load circuit 1 constituted by normally-ON n-type MOSFETs $Q_5$ and $Q_6$ is used as a pull-up load for reading the bit lines BL and $\overline{BL}$, and an output from the decoder 11 causes a word line driver 2 constituted by a p-type MOSFET $Q_9$ and an n-type MOSFET $Q_{10}$ to set the word line WL to which the selected memory cell MC belongs at high potential. The bit lines BL and $\overline{BL}$ to which the selected memory cell MC belongs are selected by a column transmission gate 3. The column transmission gate 3 is constituted by n-type MOSFETs $Q_7$ and $Q_8$, and is selectively controlled in response to a column selection signal CD as an output from the decoder 11. Therefore, data access of the memory cell MC is performed.

In the CMOS static memory, each of the controller 14, the decoder 11, a write circuit 15, and an output circuit 13 shown in FIG. 1 is constituted by a combination of logic circuits called CMOS push-pull logic circuits in which p- and n-type MOSFETs are complimentarily connected to each other. FIG. 2 shows an arrangement of a 2-input NAND gate. More specifically, the 2-input NAND gate includes p-type MOSFETs $Q_{21}$ and $Q_{22}$, and an n-type MOSFET $Q_{23}$, and C=A.B. Features of the CMOS push-pull logic circuit are as follows. Since a DC feedthrough current is not supplied to the CMOS push-pull logic circuit, power consumption in a stand-by mode can be set to "0", and an output oscillates in the entire range between a power source potential $V_{CC}$ and a ground potential $V_{SS}$. Taking the n-type MOSFET $Q_{23}$ for receiving an input A as an example, since the substrate potential of the MOSFET $Q_{23}$ is connected to the ground potential $V_{SS}$, a difference between two potentials ($V_{CC}-V_{SS}=V_{CC}$) is applied to both the ends of the gate oxide film of the MOSFET $Q_{23}$ when the input A is set at high potential, i.e., $V_{CC}$. Similarly, the potential difference $V_{CC}$ is applied to both ends of the gate oxide film of the p-type MOSFET.

As shown in the conventional arrangement in FIG. 1, a power source voltage of the CMOS static memory is directly supplied from the power source pad $V_{CC}$. Therefore, a voltage to be applied to the power source pad, i.e., an external power source voltage $V_{CC}$ is applied to the gate oxide film of each of the n- and p-type MOSFETs in the corresponding circuit constituted by the push-pull logic circuit, such as the controller 14, the decoder 11, the write circuit 15, and the output circuit 13. This situation is substantially the same in the sense amplifier 12, and a maximum of a voltage $V_{CC}$ is applied to each MOSFET. This also applies to the peripheral circuits of the memory cell MC. Since the external power source $V_{CC}$ is supplied to the load high resistors $R_1$ and $R_2$, the voltage $V_{CC}$ is applied to the internal nodes a and b of the memory cell MC. Therefore, the external power source voltage $V_{CC}$ is applied to the gate oxide films of the pull-down n-type MOSFETs $Q_1$ and $Q_2$ which constitute the memory cell MC. Since the word line driver 2 includes a CMOS push-pull inverter, the external power source voltage $V_{CC}$ is applied to the word line WL. For this reason, the external power source voltage $V_{CC}$ is applied to the gate oxide films of the transmission gate transistors $Q_3$ and $Q_4$ in the memory cell MC. In addition, since one of the bit lines BL and $\overline{BL}$ is set at a ground potential in a write mode, the external power source voltage $V_{CC}$ is also applied to the gate oxide films of the n-type MOSFETs $Q_5$ and $Q_6$ which constitute the bit line load circuit 1, and the gate oxide films of the column transmission gate n-type MOSFETs $Q_7$ and $Q_8$.

Thus, in the conventional CMOS static memory, the external power source voltage $V_{CC}$ is directly applied to both the ends of the gate oxide films of all the MOSFETs in the peripheral circuits for performing a write/read operation for the memory cell. The thicknesses of the oxide films of the MOSFETs are all equal to each other because the films are formed by one oxidation step.

In order to realize a high-capacity and high-integration CMOS static memory, a gate length L of the MOSFET must be shortened. With this shortening in gate length, the MOSFETs must be optimized, and a subthreshold current when each transistor is OFF must be decreased. In addition, the thickness of the gate oxide film must be decreased to reduce a short-channel effect of the transistors. An example of a silicon gate oxide film tox which is optimal with respect to the gate length L is shown in FIG. 3.

Along with a decrease in thickness of the gate oxide film tox, however, an allowable maximum voltage which can be applied is reduced in consideration of long-term reliability of the oxide film because an intensity of an electric field in the oxide film is increased with a decrease in thickness of the gate oxide film. FIG. 4 shows a relationship between the thickness of the silicon gate oxide film tox and an allowable application voltage. On the other hand, the external power source voltage $V_{CC}$ of the CMOS static memory is normally set to be 5V±0.5V. As is understood from FIGS. 3 and 4, therefore, when a high-capacity CMOS static memory having an external power source voltage of 5 V is arranged according to a prior art using a MOSFET having a gate length of 0.6 μm or less, reliability of the gate oxide film is degraded, and 10-year guarantee as a high-reliability product is impossible.

An arrangement of the conventional memory to compensate for the above disadvantage is shown in FIG. 5. A block diagram of the conventional arrangement shown in FIG. 1 is shown in FIG. 6 for reference. A difference between FIGS. 6 and 5 is as follows. In FIG. 6, the external power source voltage $V_{CC}$ is directly applied to the MOSFETs used in peripheral circuits 16, the memory cell MC, the word line driver 2, and the bit line load circuit 1. On the contrary, in FIG. 5, an internal power source voltage $V_{CC}$, ($<V_{CC}$) generated from the external power source voltage $V_{CC}$ using a power source voltage drop circuit 17 is applied to the MOSFETs used in the peripheral circuits 16, the memory cell MC, the word line driver 2, and the bit line load circuit 1. Therefore, a voltage to be applied to the gate oxide films of the MOSFETs is a voltage $V_{CC}$, lower than the external power source voltage $V_{CC}$, thus improving reliability of the gate oxide film.

Since an instantaneous current consumption of the static memory normally exceeds 100 mA, however, a current capacity margin of the power source voltage drop circuit 17 must be sufficiently taken with respect to the instantaneous current consumption. When the power source voltage drop circuit 17 is constituted by MOSFETs, it is difficult to achieve a current capacity corresponding to the instantaneous current consumption of the memory. Therefore, a variation in internal power source voltage $V_{CC}$, is increased, and an internal operation of the memory is undesirably unstable.

Although such a power source voltage drop circuit 17 includes a reference potential generator for controlling the internal power source voltage $V_{CC}$, this generator requires a current consumption of 10 μA or more in a stand-by mode. For this reason, a function which is a feature of the CMOS static memory, i.e., a current consumption of 2 μA or less in the stand-by mode to allow battery back-up may be lost.

As described above, in the memory cell wherein the external power source voltage is applied to the gate of each n-type MOSFET, it is difficult to decrease the thickness of each gate oxide film and to shorten its gate length in consideration of long-term reliability of the gate oxide film, and hence realization of a high-capacity and high-integration memory has been prevented.

In order to achieve a high-capacity and high-integration memory, it may be proposed to generate a low internal power source voltage by the external power source voltage drop circuit, and to apply the resultant voltage to the entire static memory. In this case, however, it is difficult to obtain a current capacity corresponding to an instantaneous current consumption of the static memory, and a current consumption in a stand-by mode is undesirably increased.

SUMMARY OF THE INVENTION

The present invention has been made in consideration of the above situations, and has as its object to provide a high-reliability, high-capacity, and high-integration CMOS static memory without an increase in current consumption in a stand-by mode.

In order to achieve the above object, there is provided a CMOS static memory comprising a memory cell array constituted by a plurality of memory cells two-dimensionally arranged in word and bit line directions, each of the memory cells being provided with a flip-flop circuit constituted by a pair of pull-down n-type MOSFETs and a pair of pull-up resistor elements, and a pair of transmission gate n-type MOSFETs, a source of each of which is connected to a corresponding one of a pair of output terminals of the flip-flop circuit, a gate of each of which is connected to a word line, and a drain of each of which is connected to a corresponding one of a pair of bit lines, and peripheral circuits including n-type MOSFETs for performing a write/read operation for the memory cell, wherein the pair of pull-down n-type MOSFETs and the pair of transmission gate n-type MOSFETs each have a gate oxide film whose thickness and gate length are smaller than those of the gate oxide films of the n-type MOSFETs of the peripheral circuits.

With the above arrangement, according to the present invention, there is provided a CMOS static memory in which first n-type MOSFETs each having a thin gate oxide film and a short gate length are used for only transistors which constitute the memory cell, and second n-type MOSFETs each having a gate oxide film with a thickness and a gate length which are larger than those of each first n-type MOSFET are used for peripheral circuits for performing a write/read operation of memory cells except for the memory cells, such as a bit line load circuit, a word line driver, a column transmission gate, a controller, a decoder, a sense amplifier, a write circuit, and an output circuit, so that an external power source voltage $V_{CC}$, i.e., a voltage of 5V is directly applied to the circuits except for the memory cell, thus guaranteeing long-term reliability of the gate oxide films. On the other hand, an output from, e.g., the word line driver, is set at a voltage ($V_{CC}-V_{TN}$) lower than the external power source voltage by a threshold voltage $V_{TN}$ of each second n-type MOSFET. Therefore, a voltage to be applied to the gate oxide film of each first n-type MOSFET used for the memory cell is lower than the external power source voltage. Therefore, long-term reliability of the gate oxide film can be guaranteed.

In addition, in the CMOS static memory according to the present invention, the external power source voltage can be directly applied to the peripheral circuits without a power source voltage drop circuit. Therefore, an unstable operation of the peripheral circuits can be prevented, and an increase in power consumption in a stand-by mode due to the power source voltage drop circuit is not caused.

BRIEF DESCRIPTION OF THE DRAWINGS

FIG. 3 is a graph showing a relationship between a gate length L of an n-type MOSFET and an optimal thickness of a gate oxide film with respect to the gate length L;

FIG. 4 is a graph showing a relationship between a thickness of the gate oxide film and an allowable application voltage applied to the film;

FIG. 6 is a block diagram showing an arrangement in order to compare the circuit arrangement shown in FIG. 1 with that in the block diagram shown in FIG. 5;

FIG. 8 is a circuit diagram showing another arrangement of a word line driver shown in FIG. 7.

DETAILED DESCRIPTION OF THE PREFERRED EMBODIMENTS

An embodiment of the present invention will be described hereinafter with reference to FIGS. 7 and 8.

Figure 1:
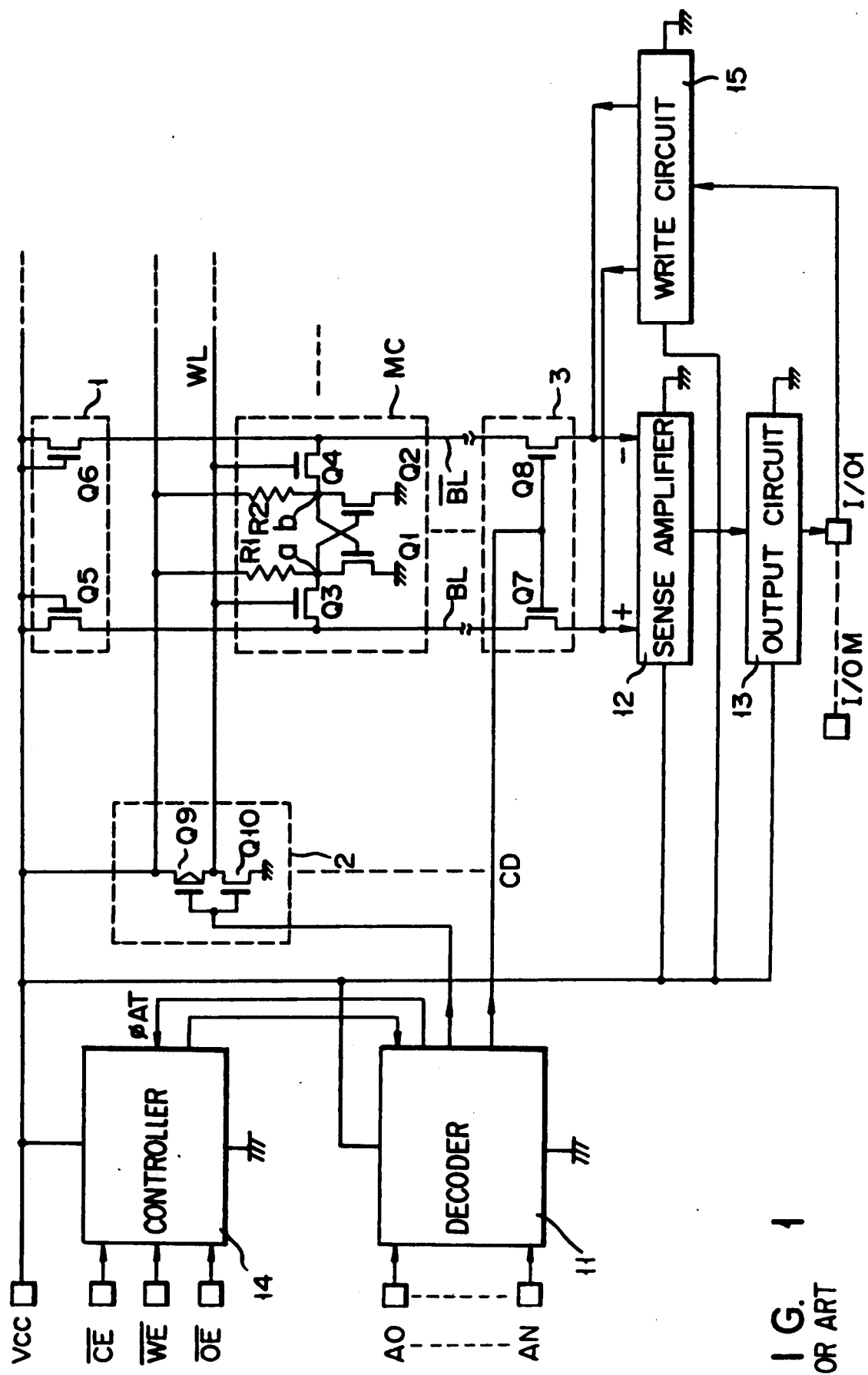
FIG. 1 is a circuit diagram showing an arrangement of a conventional CMOS static memory.
Figure 2:
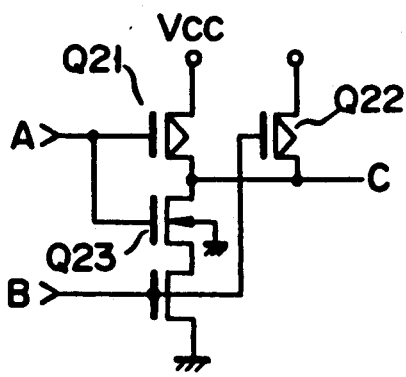
FIG. 2 is a circuit diagram showing a 2-input NAND gate in known CMOS push-pull logic circuits.
Figure 5:
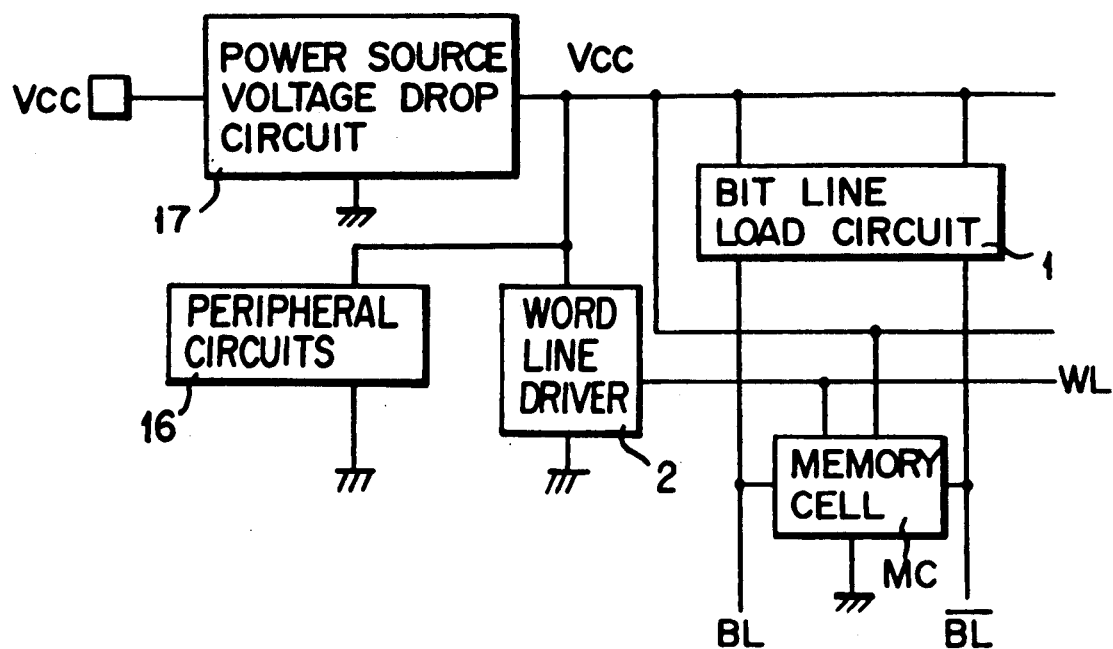
FIG. 5 is a block diagram showing an arrangement of the conventional CMOS static memory using a power source voltage drop circuit.
Figure 7:
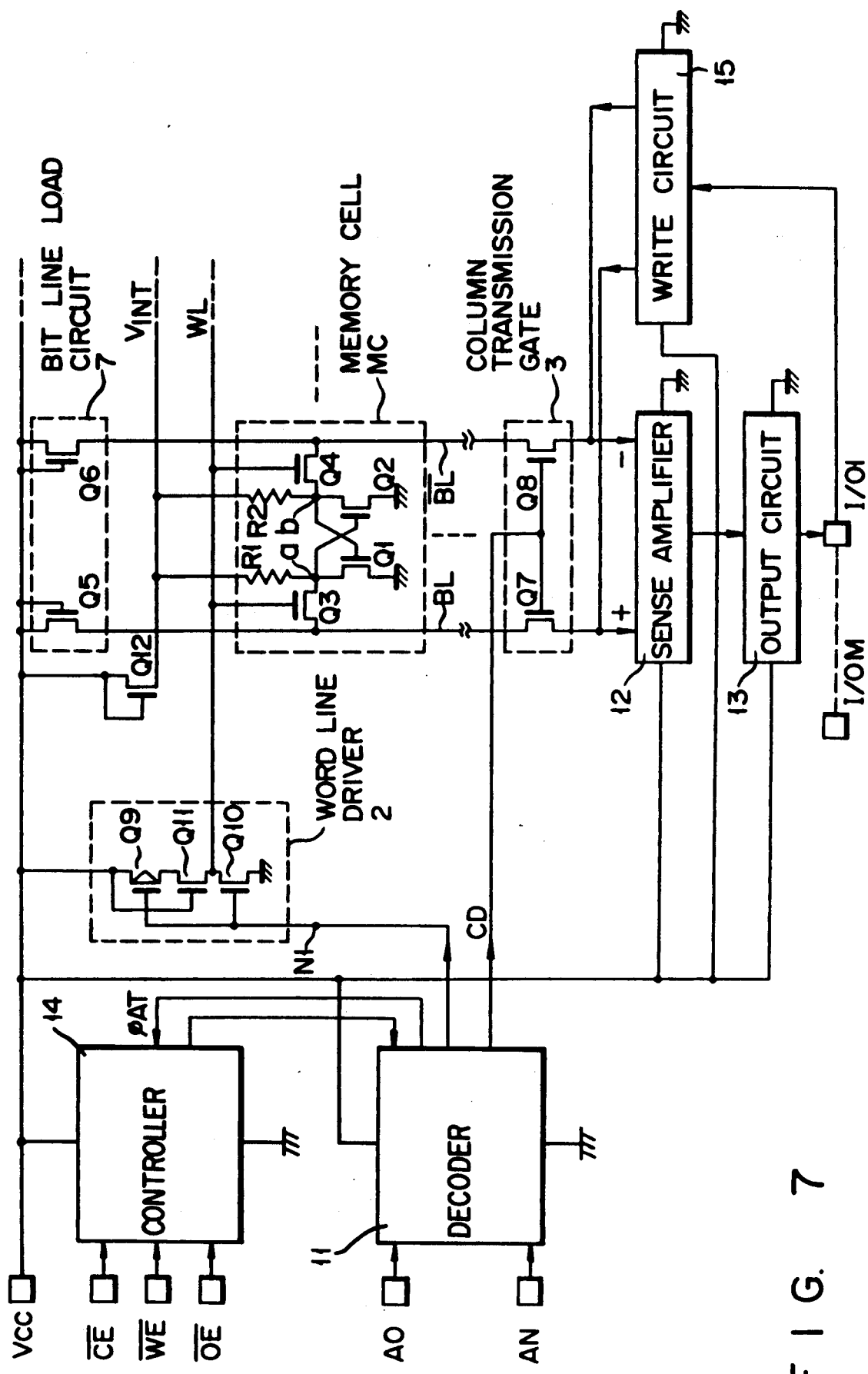
FIG. 7 is a circuit diagram showing an arrangement of a CMOS static memory according to an embodiment of the present invention.

A memory cell MC of a CMOS static memory according to the present invention shown in FIG. 7 includes a flip-flop circuit constituted by pull-up high resistors $R_1$ and $R_2$ connected to a power source $V_{CC}$ and pull-down n-type MOSFETs $Q_1$ and $Q_2$, and transmission gate transistors $Q_3$ and $Q_4$ selectively controlled by a word line WL. One end of each of the transistors $Q_3$ and $Q_4$ is connected to the corresponding one of a pair of bit lines BL and $\overline{BL}$, and the other end of each thereof is connected to the corresponding one of internal nodes a and b in the flip-flop circuit. The static memory includes a memory cell array constituted by two-dimensionally arranging a large number of memory cells MC in a word line WL direction and a bit line BL direction. Address input signals $A_0$ to $A_n$ are decoded by a decoder 11. When one word line WL and one pair of bit lines BL and $\overline{BL}$ are selected, data in the memory cell MC corresponding to a predetermined address is read or written. During a data read operation, complementary data of the bit lines BL and $\overline{BL}$ is differentially amplified by a sense amplifier 12, and the resultant data is output to data input/output signal pins I/O1 to I/OM by an output circuit 13, where M is the word length of the static memory. The static memory is controlled by a controller 14 for receiving a chip selection signal pin $\overline{CE}$, a read/write selection signal pin $\overline{WE}$, an output selection signal pin $\overline{OE}$, and an address transition detection signal $\phi_{AT}$ generated by the decoder 11.

A control operation of peripheral circuits of the memory cell MC will be described below. A bit line load circuit 7 constituted by normally-ON n-type MOSFETs $Q_5$ and $Q_6$ is used as a pull-up load for reading the bit lines BL and $\overline{BL}$. An output from the decoder 11 causes a word line driver 2 constituted by a p-type MOSFET $Q_9$ and an n-type MOSFET $Q_{10}$ to set the word line WL to which the selected memory cell MC belongs at high potential. The bit lines BL and $\overline{BL}$ to which the selected memory cell MC belongs are selected by a column transmission gate 3. The column transmission gate 3 is constituted by n-type MOSFETs $Q_7$ and $Q_8$, and is selectively controlled in response to a column selection signal CE as an output from the decoder 11. Therefore, data access of the memory cell MC is performed.

In the CMOS static memory, each of the controller 14, the decoder 11, a write circuit 15, and an output circuit 13 is constituted by a combination of logic circuits called CMOS push-pull logic circuits in which p- and n-type MOSFETs are complimentarily connected to each other. Each of the pull-down n-type MOSFETs $Q_1$ and $Q_2$, and the transmission gate n-type MOSFETs $Q_3$ and $Q_4$ in the memory cell MC shown in FIG. 7 according to an embodiment of the present invention has a short gate length L of, e.g., 0.6 μm or less. The thickness of the gate oxide film is optimized in correspondence with the gate length. For example, the thickness of the gate oxide film is as small as 120 Å or less. Therefore, the gate length L of the memory cell MC which occupies almost the entire chip area can be processed to be short, thus realizing a high-integration and high-capacity static memory.

The peripheral circuits except for the memory cell MC including the bit line load circuit 7, the word line driver 2, the column transmission gate 3, the controller 14, the decoder 11, the sense amplifier 12, the write circuit 15, and the output circuit 13 are required for the CMOS static memory. The thickness and the gate length of the gate oxide film of the n- and p-type MOSFETs which constitute each circuit in these peripheral circuits are larger than those of the MOSFETs used in the memory cell MC. When one oxidation process is added, the above increase in thickness and gate length of the gate oxide film can be achieved. An external power source voltage $V_{CC}$ is directly applied to the circuits except for the memory cells MC. Therefore, the external power source voltage $V_{CC}$, i.e., a voltage of 5V, is directly applied to the gate oxide film. Since the MOSFETs each having a thick oxide film are used as described above, however, long-term reliability of the gate oxide film can be guaranteed. The gate length of each MOSFET is relatively long in correspondence with the thickness of the gate oxide film. Therefore, characteristics of the MOSFETs such as a short-channel effect are not degraded. In addition, the external power source voltage $V_{CC}$ can be directly applied to the peripheral circuits, and the voltage is not passed through the power source voltage drop circuit. Therefore, a sufficient current capacity of a power source can be obtained, and a stable operation of the peripheral circuits can be guaranteed. Since the power source voltage drop circuit is not used, a current consumption in a stand-by mode is not increased.

An arrangement of the word line driver used for the CMOS static memory according to the present invention will be described hereinafter with reference to FIG. 7. In this word line driver, a normally-ON n-type MOSFET $Q_{11}$ is inserted between a p-type MOSFET $Q_9$ and an n-type MOSFET $Q_{10}$ which constitute a normal CMOS push-pull inverter. An effect caused by insertion of the n-type MOSFET $Q_{11}$ is as follows. If the n-type MOSFET $Q_{11}$ serving as a transistor with a thick gate oxide film has a threshold voltage $V_{TN}$, high potential of the word line is $V_{CC}-V_{TN}$. Therefore, the external power source voltage $V_{CC}$ is not directly applied to the gate oxide films of the memory cell transmission gate n-type MOSFETs $Q_3$ and $Q_4$. An arrangement of the word line driver 2 is not limited to that in FIG. 7, and another circuit for setting the high potential of the word line to be $V_{CC}-V_{TN}$ may be used. On the other hand, a circuit having power source voltage dependency that the high potential of the work line is $V_{CC}-V_{TN}$ when the voltage $V_{CC}$ is about 5V, and the high potential is $V_{CC}$ when the voltage $V_{CC}$ is about 3V can be used. Another arrangement of the word line driver for extracting a potential $V_{CC}-V_{TN}$ at the word line WL is shown in FIG. 8. This driver includes n-type MOSFETs $Q_{24}$ and $Q_{25}$ and an inverter I1. The inverter I1 is arranged in the decoder 11.

A supply power source voltage $V_{INT}$ of $V_{CC}-V_{TN}$ is also applied to high resistors $R_1$ and $R_2$ in the memory cell MC shown in FIG. 7 through a normally-ON n-type MOSFET $Q_{12}$. Therefore, a voltage of each of the internal nodes a and b in the memory cell does not exceed a voltage $V_{CC}-V_{TN}$, and hence the external power source voltage $V_{CC}$ is not directly applied to the gate oxide films of the pull-down n-type MOSFETs $Q_1$ and $Q_2$ in the memory cell. Since a current supplied to the high resistors $R_1$ and $R_2$ in the memory cell MC is 1 mA or less, a current supply capacity of the power source $V_{INT}$ may be about 1 mA, and the voltage $V_{INT}$ does not vary.

As has been described above, the external power source voltage $V_{CC}$ is not directly applied, but a voltage $V_{CC}-V_{TN}$ lower than the external power source voltage $V_{CC}$ by 1V or more is applied to the gate oxide films of all the n-type MOSFETs $Q_1$, $Q_2$, $Q_3$, and $Q_4$ each of which has a thin gate oxide film and which constitute the memory cell MC. Therefore, long-term reliability of the gate oxide films of the memory cell can be guaranteed.

Since only an n-type MOSFET used for the memory cell MC has a thin gate oxide film, only the n-type MOSFETs are required to be optimized so as to have a thin gate oxide film. therefore, a p-type MOSFET is not required, thus simplifying manufacturing process.

What is claimed is:

1. A CMOS static memory comprising:
    a memory cell array constituted by a plurality of memory cells two-dimensionally arranged in word and bit line directions, each of the memory cells being provided with a flip-flop circuit constituted by a pair of pull-down n-type MOSFETs and a pair of pull-up resistor elements, and a pair of transmission gate n-type MOSFETs, a source of each of which is connected to a corresponding one of a pair of output terminals of said flip-flop circuit, a gate of each of which is connected to a word line, and a drain of each of which is connected to a corresponding one of a pair of bit lines; and
    peripheral circuits including n-type MOSFETs for performing a write/read operation for each of said memory cells, wherein said pair of pull-down n-type MOSFETs and said pair of transmission gate n-type MOSFETs each have a gate oxide film whose thickness and gate length are less than those of the gate oxide films of said n-type MOSFETs of said peripheral circuits.

2. A memory according to claim 1, wherein a voltage lower than an external supply voltage by a threshold value of one of the n-type MOSFETs of said peripheral circuit is applied to said n-type MOSFETs used for said memory cells.

* * * * *